(12) United States Patent
Zhang

(10) Patent No.: US 9,287,108 B2
(45) Date of Patent: Mar. 15, 2016

(54) PRE-CLEANING METHOD AND PREPARATION METHOD OF LOW-TEMPERATURE POLYSILICON THIN FILM, LIQUID CRYSTAL DISPLAY DEVICE, AND MANUFACTURING SYSTEM THEREOF

(71) Applicant: Shenzhen China Star Optoelectronics Technology Co., Ltd., Shenzhen, Guangdong (CN)

(72) Inventor: Longxian Zhang, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 28 days.

(21) Appl. No.: 14/234,144

(22) PCT Filed: Dec. 27, 2013

(86) PCT No.: PCT/CN2013/090627
§ 371 (c)(1),
(2) Date: Jan. 21, 2014

(87) PCT Pub. No.: WO2015/096113
PCT Pub. Date: Jul. 2, 2015

(65) Prior Publication Data
US 2015/0214036 A1    Jul. 30, 2015

(30) Foreign Application Priority Data

Dec. 25, 2013    (CN) .......................... 2013 1 0728592

(51) Int. Cl.
*H01L 21/02*    (2006.01)
*H01L 21/67*    (2006.01)
*C30B 25/08*    (2006.01)

(Continued)

(52) U.S. Cl.
CPC ............ *H01L 21/02052* (2013.01); *B08B 3/08* (2013.01);

(Continued)

(58) Field of Classification Search
CPC ................... H01L 21/02052; H01L 21/02592; H01L 21/02636; H01L 21/67051; H01L 21/67207; H01L 21/67098; H01L 21/02675; H01L 21/02532; H01L 21/02; H01L 27/1214; H01L 27/1285; H01L 29/42384; H01L 21/02436; H01L 21/02595; H01L 29/6675; H01L 29/78672; C30B 25/08; C30B 25/10; C30B 25/183; B08B 3/08
USPC .................................................. 438/481, 486
See application file for complete search history.

(56) References Cited

U.S. PATENT DOCUMENTS 6,329,268 B1* 12/2001 Nakamori et al. ............ 438/482
2002/0110964 A1* 8/2002 Cheng et al. .................. 438/166

Primary Examiner — Caleen Sullivan
(74) Attorney, Agent, or Firm — Andrew C. Cheng

(57) ABSTRACT

The present invention relates to the field of liquid crystal displaying techniques, and in particular to a preparation method of low-temperature polysilicon thin film, including: growing a buffer layer and then an amorphous silicon layer on the substrate; heating up an amorphous silicon layer to reach a temperature higher than room temperature, and performing pre-cleaning on the amorphous silicon layer; and using excimer laser annealing (ELA) to radiate on the pre-cleaned amorphous silicon layer in previous step to transform the amorphous silicon into polysilicon. The present invention further provides a manufacturing system of low-temperature polysilicon thin film. By improving the manufacturing system of the low-temperature polysilicon thin film and pre-cleaning method, the present invention improves thickness non-uniformity of the amorphous silicon layer and the uniformity of the polysilicon layer transformed in the subsequent step of ELA radiation.

3 Claims, 2 Drawing Sheets

(51) Int. Cl.
*C30B 25/10* (2006.01)
*C30B 25/18* (2006.01)
*B08B 3/08* (2006.01)

(52) U.S. Cl.
CPC ............... *C30B 25/08* (2013.01); *C30B 25/10* (2013.01); *C30B 25/183* (2013.01); *H01L 21/02422* (2013.01); *H01L 21/02488* (2013.01); *H01L 21/02532* (2013.01); *H01L 21/02592* (2013.01); *H01L 21/02636* (2013.01); *H01L 21/02675* (2013.01); *H01L 21/02686* (2013.01); *H01L 21/67051* (2013.01); *H01L 21/67098* (2013.01); *H01L 21/67109* (2013.01); *H01L 21/67207* (2013.01)

(a)

(b)

PRE-CLEANING METHOD AND PREPARATION METHOD OF LOW-TEMPERATURE POLYSILICON THIN FILM, LIQUID CRYSTAL DISPLAY DEVICE, AND MANUFACTURING SYSTEM THEREOF

BACKGROUND OF THE INVENTION

1. Field of the Invention

The present invention relates to the field of liquid crystal displaying techniques, and in particular to a preparation method of low-temperature polysilicon thin film.

2. The Related Arts

As the panel display device progresses, the demands of high resolution and low energy consumption display panel also increases, which propels the demands of the manufacturing material for the display panel. Among the possible materials, the low-temperature polysilicon material is widely studies. This material can be obtained by using the non-silicon material at a lower reaction temperature and provides high electronic transfer rate, and thus is applicable to manufacture C-MOS circuit to obtain higher resolution and lower energy consumption display panels.

At present, the methods to manufacture the low-temperature polysilicon material includes solid phase crystallization (SPC), metal induced crystallization (MIC), and excimer laser annealing (ELA), wherein the ELA is the most commonly used method.

The ELA method to manufacture the low-temperature polysilicon is as follows: first, growing a buffer layer on a glass substrate; then, growing an amorphous silicon layer on the buffer layer; and finally, using the laser of ELA to scan the amorphous silicon layer, so that the amorphous silicon is melted by high temperature and re-crystallized to from a polysilicon layer. However, because the thickness of the amorphous silicon film is non-uniform, which will directly affect the uniformity of the formed polysilicon layer. The low-temperature polysilicon uniformity directly affects the electrical properties. It is desirable to devise a solution to obtain a uniform polysilicon film at a low cost.

SUMMARY OF THE INVENTION

The technical issue to be addressed by the present invention is to provide a pre-cleaning method of low-temperature polysilicon thin film, which comprises: heating up an amorphous silicon layer to reach a temperature higher than room temperature, and performing pre-cleaning on the amorphous silicon layer.

According to a preferred embodiment of the present invention, the heating of the amorphous silicon layer is to make the amorphous silicon layer reach 25°-40°.

The present invention provides a preparation method of low-temperature polysilicon thin film, which comprises: step 1: growing a buffer layer and then an amorphous silicon layer on the substrate; step 2: heating up an amorphous silicon layer to reach a temperature higher than room temperature, and performing pre-cleaning on the amorphous silicon layer; and step 3: using excimer laser annealing (ELA) to radiate on the pre-cleaned amorphous silicon layer in step 2 to transform the amorphous silicon into polysilicon.

According to a preferred embodiment of the present invention, the temperature the amorphous silicon layer in step 2 is 25°-40°.

According to a preferred embodiment of the present invention, the temperature the amorphous silicon layer in step 2 comprises a first part of relatively greater thickness and a second part of relatively smaller thickness; and the heating temperature for the first part is higher than the heating temperature for the second part.

According to a preferred embodiment of the present invention, a cleaning agent applied in pre-cleaning is an aqueous solution of hydrofluoric acid of 1-3% concentration.

According to a preferred embodiment of the present invention, the hydrofluoric acid is applied for 45-60 seconds at the rate of 40-60 liters per minute (L/min) in the pre-cleaning.

The present invention provides a manufacturing system of low-temperature polysilicon thin film, which comprises: a sample table; an epitaxial growth apparatus, disposed above the sample table, configured to provide the growth of an amorphous silicon layer; an excimer laser beam, disposed above the sample table, configured to transform the amorphous silicon layer into the polysilicon layer; and further comprising: a pre-cleaning apparatus, disposed above the sample table, configured to perform pre-cleaning to the amorphous silicon layer; and a temperature control apparatus, disposed at the sample table, configured to perform heating up the amorphous silicon layer.

According to a preferred embodiment of the present invention, the pre-cleaning apparatus comprises a plurality of uniformly distributed sprinklers.

According to a preferred embodiment of the present invention, the temperature control apparatus comprises a plurality of uniformly distributed heating sets, and each of the heating sets independently comprises a thermostats and a temperature monitor.

According to a preferred embodiment of the present invention, the heating set is a resistance block or a resistance wire.

The efficacy of the present invention is that to be distinguished from the state of the art. Through improvement on the manufacturing facility of low-temperature polysilicon thin film and pre-cleaning method, the present invention increases the uniformity of the amorphous silicon layer. By introducing temperature control apparatus, in combination with pre-cleaning apparatus, the manufacturing system of the low-temperature polysilicon thin film can control the temperature of corresponding areas based on the thickness of various areas of the amorphous silicon layer so as to control the erosion speed of the various areas to achieve reducing the thickness differences among various areas. As such, the non-uniformity of the amorphous silicon layer is improved and the uniformity of the polysilicon layer transformed in the subsequent step of ELA radiation.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

The following refers to drawings and embodiments to describe the present invention in details.

Figure 1:
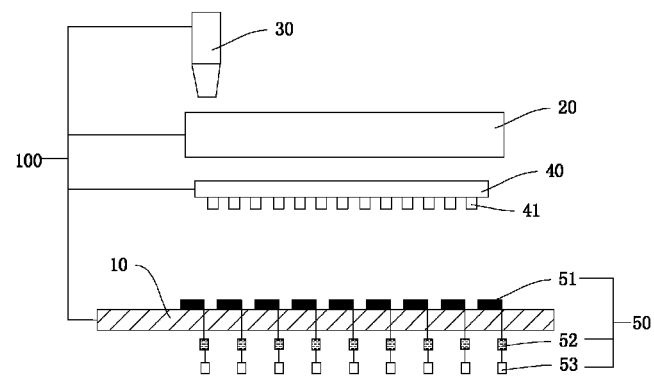
FIG. 1 is a schematic view showing the structure of an embodiment of a system of low-temperature polysilicon thin film according to the present invention.

The present invention provides a manufacturing system 100 of low-temperature polysilicon thin film. As shown in FIG. 1, the manufacturing system 100 comprises at least a sample table 10, an epitaxial growth apparatus 20, an excimer laser beam 30, a pre-cleaning apparatus 40 and a temperature control apparatus 5.

The epitaxial growth apparatus 20 is disposed above the sample table 10, configured to provide the growth of an amorphous silicon layer (not shown) on the sample table and growth of other material layers necessary for forming polysilicon thin film.

The pre-cleaning apparatus 40 is disposed above the sample table 10, which comprises a plurality of uniformly distributed sprinklers 41. The sprinklers 41 can controllably sprinkle cleaning agent for pre-cleaning the amorphous silicon material.

Figure 2:
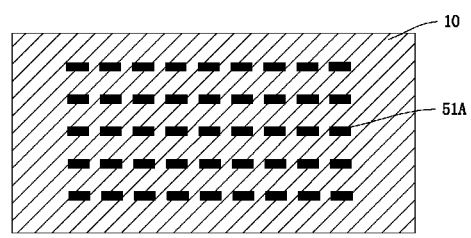
FIG. 2 (a) (b) are schematic views showing the heating sets of the temperature control apparatus arranged at the sample table according to the present invention.
Figure 2:
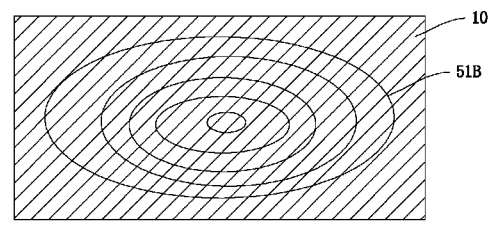

The temperature control apparatus 50 is disposed at the sample table 10, configured to perform heating up the amorphous silicon layer. In general, the amorphous silicon layer is formed on the substrate (not shown). Therefore, the temperature control apparatus 50 is to heat up the substrate directly and the substrate propagates the heat to the amorphous silicon layer. The temperature control apparatus 50 comprises a plurality of uniformly distributed heating sets 51, and each of the heating sets 51 independently comprises a thermostats 53 and a temperature monitor 52. Through the temperature monitor 52 displaying the current temperature of each heating set 51, the thermostats 53 can control and adjust the real-time temperature of each heating set 51 to target a different area for increasing or decreasing the temperature to realize performing different temperature treatment on different area of the same amorphous silicon layer. Specifically, each heating set 51 can be, for instance, a resistance block 51A or serially connected resistance blocks (not shown) distributed on the sample table 10 in a dotty pattern, as shown in FIG. 2(a). Alternatively, the heating set 51 can be resistance wires 51A surrounding the sample table 10, as shown in FIG. 2(b).

The excimer laser beam 30 is disposed above the sample table 10, configured to transform the amorphous silicon layer on the sample table 10 into the polysilicon layer. In general, the epitaxial growth apparatus 20, the excimer laser beam 30, and the pre-cleaning apparatus 40 are removably disposed so that the relative position to the sample table 10 can be adjusted according to the preparation process.

Figure 3:
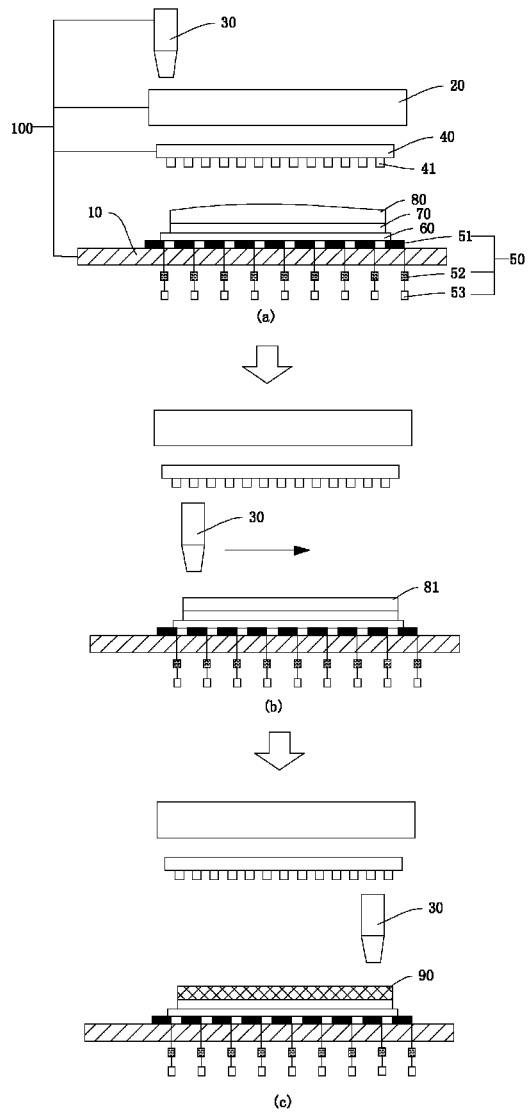
FIG. 3 (a) (b) (c) are flowcharts of the preparation of the low-temperature polysilicon thin film according to the present invention.

The following uses the above manufacturing system 100 of low-temperature polysilicon thin film to prepare polysilicon thin film, and comprises the following steps:

Step 1: as shown in FIG. 3(a), placing a glass substrate 60 on the sample table 10, and then using the epitaxial growth apparatus 20 to grow a buffer layer 70 made of silica on top of the glass substrate 60. Then, growing an amorphous silicon layer 80 on top of the buffer layer 70. The surface of the amorphous silicon layer is not uniform and smooth, and at least comprises a first part of relatively greater thickness and a second part of relatively smaller thickness. In general, the central area is thicker (the first part) and the peripheral area is thinner (the second part), as shown in FIG. 3(a); or, the central area is thinner (the second part) and the peripheral area is thicker (the first part) (not shown); or other non-uniform distribution.

Step 2: transporting the amorphous silicon layer 80 obtained in step 1 into a cleaning room for high temperature dehydrogenase process. Then, the temperature control apparatus 50 is activated to heat up the glass substrate 60 so that the temperature of the amorphous silicon layer 80 rises. The position of the pre-cleaning apparatus 40 is adjusted to aim at the surface of the amorphous silicon layer 80 for pre-cleaning.

In general, the pre-cleaning operation of the instant embodiment is performed in an environment with room temperature of 23±2° C. Targeting at the amorphous silicon layer 80 with a thicker central area and a thinner peripheral area, the real-time temperature of each heating set 51 of the temperature control apparatus 50 is adjusted so that the heating temperature of the heating set 51 corresponding to the central area is higher than the room temperature (25-40° C.), and the heating set 51 corresponding to the peripheral area does not need to heat up and the temperature is lower than the room temperature. At this point, turn on the sprinkler 41 of the pre-cleaning apparatus 40 to sprinkle the cleaning agent to perform cleaning on the amorphous silicon layer 80. The cleaning agent used in the present embodiment is an aqueous solution of hydrofluoric acid, wherein the concentration of hydrofluoric acid is of 1-3%. The total flow rate of the sprinkler 41 is set as 40-60 L/min for a duration of 45-60 seconds. For the amorphous silicon layer with a thinner central area and a thicker peripheral area, the heating temperature for various areas can be adjusted accordingly.

The effect of hydrofluoric acid is to etch a thin surface layer of the amorphous silicon layer to remove surface debris and increase the surface flatness. The etching reaction rate of hydrofluoric acid is temperature dependent; that is, higher etching rate at higher temperature and vice versa. As such, the temperature control apparatus can control the temperature of various areas of the amorphous silicon layer to achieve improving the flatness of the surface of the amorphous silicon layer. For example, the heating temperature of the heating set is adjusted higher for the thicker first area of the amorphous, and the heating temperature of the heating set is adjusted lower or stops heating for the thinner second area of the amorphous, which can be adjusted in real-time according to the actual shape of the amorphous silicon layer. In other words, the heating temperature is proportional to the thickness of each area of the amorphous silicon layer. As a result, the thicker first area of the amorphous silicon layer is etched at a faster rate and the thinner second area is etched at a slower rate. The thickness difference among the areas is continuously reduced so as to improve the flatness and the thickness uniformity of the amorphous silicon layer for the subsequent step to obtain smooth and uniform polysilicon layer.

Step 3: using excimer laser beam 30 to radiate the pre-cleaned, uniform and smooth amorphous silicon layer 81 from step 2, as shown in FIG. 3(b) to transform into polysilicon so as to obtain uniform and smooth polysilicon thin film 90, as shown in FIG. 3(c).

The manufacturing system of low-temperature polysilicon thin film provided by the present invention is easy to refit and control. Using the system to prepare polysilicon thin film is simple, convenient and the smoothness of the polysilicon thin film is improved to ensure the quality and function of the subsequently manufactured element.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A preparation method of low-temperature polysilicon thin film, which comprises:

step 1: growing a buffer layer and then an amorphous silicon layer on the substrate;

step 2: heating up an amorphous silicon layer to reach a temperature higher than room temperature, and performing pre-cleaning on the amorphous silicon layer, wherein the amorphous silicon layer comprises a first part of relatively greater thickness and a second part of relatively smaller thickness, the temperature for the first part is higher than the temperature for the second part, and the temperature of the amorphous silicon layer is 25°-40°; and step 3: using excimer laser annealing (ELA) to radiate on the pre-cleaned amorphous silicon layer in step 2 to transform the amorphous silicon into polysilicon.

2. The preparation method of low-temperature polysilicon thin film as claimed in claim 1, wherein a cleaning agent applied in pre-cleaning is an aqueous solution of hydrofluoric acid of 1-3% concentration.

3. The preparation method of low-temperature polysilicon thin film as claimed in claim 1, wherein the hydrofluoric acid is applied for 45-60 seconds at the rate of 40-60 liters per minute (L/min) in the pre-cleaning.

* * * * *